United States Patent
Kosaka et al.

(10) Patent No.: US 11,644,743 B2
(45) Date of Patent: May 9, 2023

(54) HALFTONE PHASE SHIFT-TYPE PHOTOMASK BLANK, METHOD OF MANUFACTURING THEREOF, AND HALFTONE PHASE SHIFT-TYPE PHOTOMASK

(71) Applicant: Shin-Etsu Chemical Co., Ltd., Tokyo (JP)

(72) Inventors: Takuro Kosaka, Joetsu (JP); Keisuke Sakurai, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/017,336

(22) Filed: Sep. 10, 2020

(65) Prior Publication Data

US 2021/0096455 A1 Apr. 1, 2021

(30) Foreign Application Priority Data

Sep. 27, 2019 (JP) .............................. JP2019-176829

(51) Int. Cl.
*G03F 1/32* (2012.01)

(52) U.S. Cl.
CPC ..................................... *G03F 1/32* (2013.01)

(58) Field of Classification Search
CPC ..... G03F 1/26; G03F 1/28; G03F 1/29; G03F 1/30; G03F 1/32
See application file for complete search history.

(56) References Cited

U.S. PATENT DOCUMENTS

| 5,474,864 A | 12/1995 | Isao et al. |
| 2002/0061452 A1* | 5/2002 | Nozawa .................... G03F 1/32 428/428 |

(Continued)

FOREIGN PATENT DOCUMENTS

| EP | 2 983 044 A2 | 2/2016 |
| EP | 3 309 612 A1 | 4/2018 |

(Continued)

OTHER PUBLICATIONS

Machine translation of JP 2007-183453 (2007).*

(Continued)

*Primary Examiner* — Martin J Angebranndt
(74) *Attorney, Agent, or Firm* — Birch, Stewart, Kolasch & Birch, LLP

(57) ABSTRACT

A halftone phase shift-type photomask blank including a transparent substrate, and a halftone phase shift film formed on the substrate, and including at least one layer composed of silicon, nitrogen and oxygen is provided. The halftone phase shift film has a phase shift of at least 150° and up to 200° and a transmittance of at least 20%, with respect to exposure light having a wavelength of up to 200 nm, and a film surface having a surface roughness RMS of up to 0.8 nm, and an in-plane variation of transmittance calculated from the maximum transmittance $T_{max}$ and the minimum transmittance $T_{min}$ within a mask pattern forming area by the expression: $(T_{max}-T_{min})/(T_{max}+T_{min})\times 100$ is up to 2%.

3 Claims, 4 Drawing Sheets

(56) References Cited

U.S. PATENT DOCUMENTS

| | | | |
|---|---|---|---|
| 2002/0122991 A1* | 9/2002 | Shiota | G03F 1/32 428/428 |
| 2007/0212618 A1 | 9/2007 | Yoshikawa et al. | |
| 2010/0092874 A1* | 4/2010 | Nozawa | G03F 1/54 430/5 |
| 2015/0125785 A1* | 5/2015 | Inazuki | G03F 1/26 430/5 |
| 2016/0033858 A1* | 2/2016 | Kosaka | G03F 1/26 430/5 |
| 2016/0291452 A1 | 10/2016 | Sasamoto et al. | |
| 2016/0291453 A1* | 10/2016 | Inazuki | G03F 1/26 |
| 2016/0291454 A1* | 10/2016 | Kosaka | G03F 1/32 |
| 2017/0059983 A1* | 3/2017 | Kosaka | G03F 1/26 |
| 2018/0059532 A1* | 3/2018 | Inazuki | C23C 14/0652 |
| 2018/0088457 A1* | 3/2018 | Inazuki | G03F 1/32 |
| 2018/0335692 A1* | 11/2018 | Nam | G03F 1/80 |

FOREIGN PATENT DOCUMENTS

| | | |
|---|---|---|
| JP | 7-140635 A | 6/1995 |
| JP | 2006-184353 A | 7/2006 |
| JP | 2007-33469 A | 2/2007 |
| JP | 2007-183453 * | 7/2007 |
| JP | 2007-233179 A | 9/2007 |
| JP | 2007-241065 A | 9/2007 |
| WO | WO 2006/123630 A1 | 11/2006 |

OTHER PUBLICATIONS

Extended European Search Report for European Application No. 20196316.2, dated Mar. 23, 2021.

Faure et al., "Characterization of Binary and Attenuated Phase Shift Mask Blanks for 32 nm Mask Fabrication," Proc. of SPIE, vol. 7122, pp. 712209-1 to 712209-12.

* cited by examiner

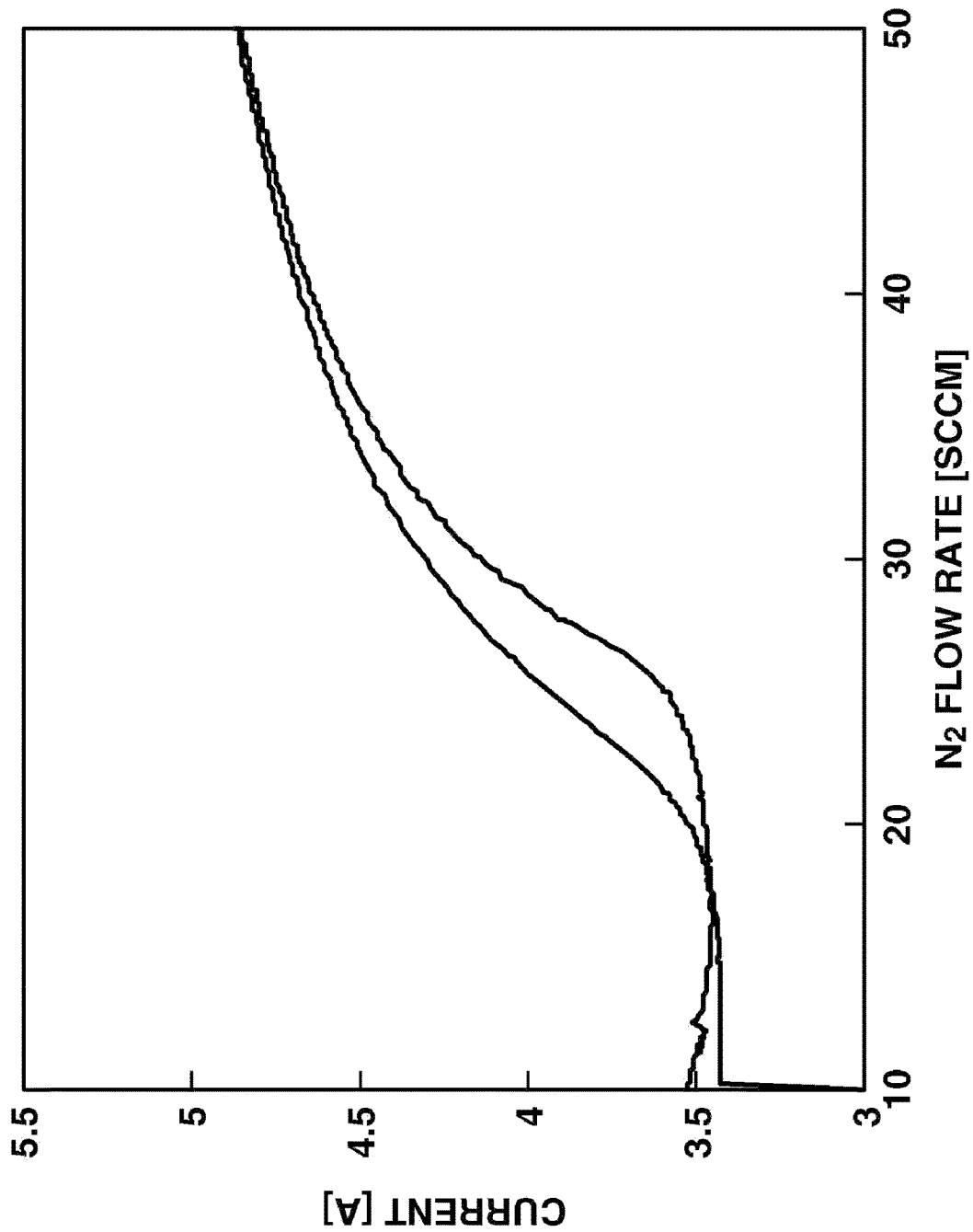

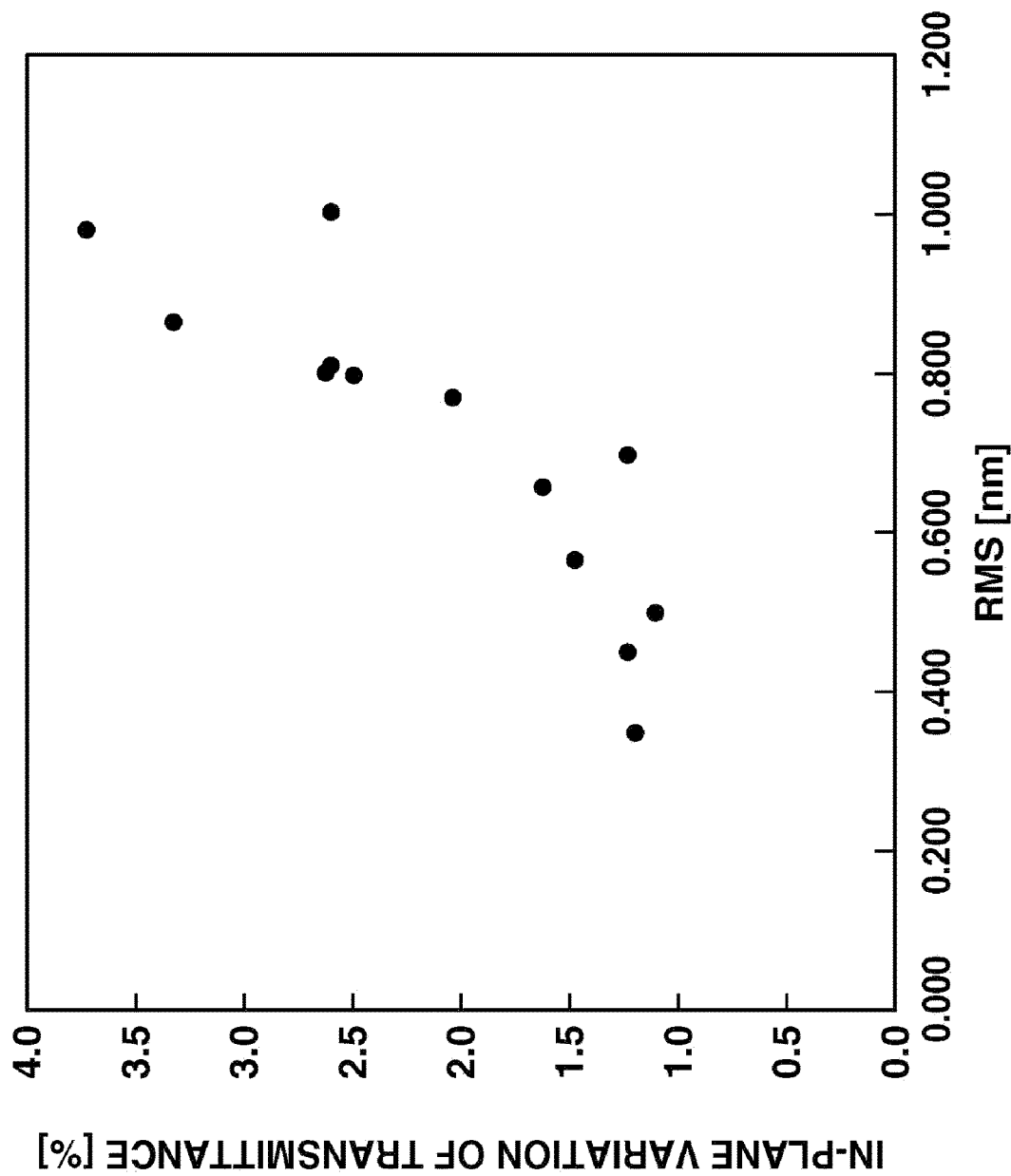

HALFTONE PHASE SHIFT-TYPE PHOTOMASK BLANK, METHOD OF MANUFACTURING THEREOF, AND HALFTONE PHASE SHIFT-TYPE PHOTOMASK

CROSS-REFERENCE TO RELATED APPLICATION

This non-provisional application claims priority under 35 U.S.C. § 119(a) on Patent Application No. 2019-176829 filed in Japan on Sep. 27, 2019, the entire contents of which are hereby incorporated by reference.

TECHNICAL FIELD

The present invention relates to a halftone phase shift-type photomask blank suitable for a material of a halftone phase shift-type photomask used in manufacturing a semiconductor integrated circuit or the like, a method of manufacturing thereof, and a halftone phase shift-type photomask.

BACKGROUND ART

In the technical field of semiconductor, research and development for further miniaturization of pattern is in progress. Particularly, as integration of large-scale integrated circuit has advanced in recent years, there is accelerated trends towards miniaturization of circuit pattern, finer interconnect pattern, and miniaturization of pattern of contact hole used for interlayer connection that composes a cell, creating further demands for fine processing technology. Under such situation, there have been growing demands for development of a technology for forming finer and more precise circuit pattern (mask pattern), also in a technical field of manufacturing photomask used for photolithographic process in fine processing.

Reduction projection is a most typical method for forming a pattern on a semiconductor substrate using photolithographic technology. For this purpose, the pattern size on the photomask is normally about four times larger than pattern to be drawn on the semiconductor substrate. In the field of lithographic technology, size of circuit pattern to be drawn is considerably smaller than wavelength of light used for exposure in these days. Therefore, if a photomask pattern is simply formed as a four-times magnification of the circuit pattern, the original pattern of a photomask cannot be accurately transferred to a resist film on the semiconductor substrate because interference of light caused in exposure is affected to the transfer.

Thus, a pattern to be formed on the photomask is formed more intricate than the actual circuit pattern to moderate such influence of interference of light in some cases. A pattern configuration for this purpose is exemplified by a configuration applied optical proximity correction (OPC) to the actual circuit pattern. Further, technique such as modified illumination, immersion lithography, double patterning lithography and the like is applied for pattern miniaturization and accuracy enhancement.

As one of the resolution enhancement technology (RET), a phase shift method is used. The phase shift method is a contrast enhancing method by utilizing interference of light caused by a film pattern capable of inverting phase approximately 180° formed in the photomask. A halftone phase shift-type photomask is one of the photomasks employing such method. The halftone phase shift-type photomask includes a transparent substrate made of quartz or the like, which is transparent to exposure light, and a photomask pattern made of a halftone phase shift film formed thereon, which can invert the phase approximately 1800 and has a transmittance insufficient to contribute to pattern formation.

An exemplary halftone phase shift-type photomask, ever proposed, includes a halftone phase shift film composed of molybdenum silicon oxide (MoSiO), or molybdenum silicon oxynitride (MoSiON) (JP-A H07-140635 (Patent Document 1)).

For the purpose of forming finer images by photolithography, light of shorter wavelength has been used as the light source. In the currently most advanced stage of lithography process, the exposure light source has made a transition from KrF excimer laser (248 nm) to ArF excimer laser (193 nm).

As the exposure dose of ArF excimer laser light irradiated for pattern transfer increases, the line width of the mask pattern changes in accordance with the cumulative irradiation energy dose, as reported in Non-Patent Document 1 (Thomas Faure et al., "Characterization of binary and attenuated phase shift mask blanks for 32 nm mask fabrication," Proc. of SPIE, vol. 7122, pp 712209-1 to 712209-12). This problem is that as the cumulative irradiation energy dose increases during long-term irradiation of ArF excimer laser light, a layer of a substance which is considered to be an oxide of the pattern material grows outside the film pattern, whereby the pattern width changes.

Non-Patent Document 1 points out that upon exposure of a circuit pattern through a halftone phase shift-type photomask which is the mask technology useful in expanding the depth of focus, substantial degradation is induced by pattern size variation resulting from alteration of a transition metal/silicon-based material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

In the photomasks used in the lithography using ArF excimer laser light as light source, a transition metal silicon-based material, typically a silicon-based material containing molybdenum is used for the halftone phase shift-type photomask. This transition metal silicon-based material is mainly composed of a transition metal and silicon, and further contains oxygen and/or nitrogen as a light element (e.g., Patent Document 1). Further, the transition metal silicon-based material may be added with a small amount of an element such as carbon, hydrogen, and other elements.

However, when a photomask using such a transition metal-containing silicon-based material is exposed to a large dose of high-energy radiation, the mask undergoes significant pattern size variation degradation by irradiation of high-energy radiation, thereby a lifetime of the photomask will be shortened than the requirement. Further, it is a problem that when a photomask pattern of the transition metal silicon-based material is irradiated with ArF excimer laser light, the photomask pattern for exposure experiences a variation of line width. Thus, a halftone phase shift photomask of a material composed of silicon and nitrogen and free of a transition metal has also been used.

CITATION LIST

Patent Document 1: JP-A H07-140635
Patent Document 2: JP-A 2007-033469
Patent Document 3: JP-A 2007-233179
Patent Document 4: JP-A 2007-241065

Non-Patent Document 1: Thomas Faure et al., "Characterization of binary and attenuated phase shift mask blanks for 32 nm mask fabrication," Proc. of SPIE, vol. 7122, pp 712209-1 to 712209-12

DISCLOSURE OF INVENTION

A transmittance of a halftone phase shift film was commonly a transmittance of up to 20%, typically about 6%, however, recent studies are also directed to higher transmittance. The film having a high transmittance has also a high attenuation effect of light due to interference, making an advantage for fine patterning in some cases. Besides, the halftone phase shift film is mostly formed by reactive sputtering. It is effective to add oxygen to the film to form a film having a transmittance of at least 20%. Particularly, it is necessary to add oxygen to the film to form a film having a transmittance of at least 25%.

When a film composed of silicon, nitrogen and oxygen is formed by sputtering, and, as reactive gases, oxygen gas is used with nitrogen gas, a large amount of reactive gases must be fed to increase transmittance while forming the film. In addition, when heat treatment is performed after forming the halftone phase shift film, it is necessary to be set a high temperature for the heat treatment in some cases. For these reasons, when the film composed of silicon, nitrogen and oxygen is formed by sputtering, in-plane variation of transmittance tends to be large.

The invention was made in order to solve the aforementioned problems, and an object of the invention is to provide a halftone phase shift-type photomask blank and a halftone phase shift-type photomask having a halftone phase shift film that has a good uniformity in film quality, particularly, high in-plane uniformity of transmittance. Further, an object of the invention is to provide a manufacturing method of such a halftone phase shift-type photomask blank.

The inventors have found that one of the factors relating to in-plane variation of transmittance of the film composed of silicon, nitrogen and oxygen is the surface roughness of the film. In other words, under a condition where the surface of the halftone phase shift film is contacted with oxygen gas, for example, under a condition where the halftone phase shift film is handled under air atmosphere, or under a condition where the halftone phase shift film is heat-treated under oxygen-containing atmosphere, a film having a high surface roughness is readily to be proceed oxidation since the halftone phase shift film has a wide surface area that can contact to oxygen gas. Therefore, the film having a high surface roughness tends to have high variation in-plane of transmittance. Meanwhile, nitrogen has low reactiveness compared to oxygen. Thus, under a condition where the surface of the halftone phase shift film is contacted with nitrogen gas, for example, under a condition where the halftone phase shift film is handled under air atmosphere, or a condition where the halftone phase shift film is heat-treated under nitrogen-containing atmosphere, a film having a high surface roughness slightly influences to in-plane uniformity of transmittance by nitrogen. However, the inventors have found that nitrogen has a different effect from oxygen to in-plane variation of transmittance of the film. When the film composed of silicon, nitrogen and oxygen is formed by sputtering, nitrogen distribution is generated on the surface of silicon target under the sputtering condition in which a small amount of nitrogen gas is fed. The phenomenon is a factor that increases the in-plane variation of transmittance of the film.

Accordingly, the inventors have found that in a phase shift film having a phase shift of at least 150° and up to 200° and a transmittance of at least 20%, with respect to exposure light having a wavelength of up to 200 nm, including at least one layer composed of silicon, nitrogen and oxygen, and having a film surface having a surface roughness RMS of up to 0.8 nm can provide a halftone phase shift-type photomask blank including a halftone phase shift film having high in-plane uniformity of transmittance such as an in-plane variation of up to 2% within a mask pattern forming area of the film surface.

Further, the inventors have found that when the layer composed of silicon, nitrogen and oxygen is formed by sputtering with disposing at least one silicon target in a chamber and feeding argon gas, nitrogen gas and oxygen gas into the chamber, preferably, the flow rate of the nitrogen gas is set in accordance with a hysteresis curve that is obtained when the flow rate of nitrogen gas fed into the chamber is swept by increasing the flow rate, and then decreasing the flow rate; the hysteresis curve is drawn by the flow rate and a sputtering voltage or a sputtering current measured on one target upon the sweeping; and the sputtering is performed under a sputtering condition of transition mode in which a flow rate of nitrogen gas is within a range between more than the lowest flow rate and less than the highest flow rate of the hysteresis, particularly under a chamber pressure of at least 0.05 Pa and less than 0.15 Pa. By the method, a halftone phase shift-type photomask blank including a halftone phase shift film having high in-plane uniformity of transmittance can be manufactured.

In one aspect, the invention provides a halftone phase shift-type photomask blank including a transparent substrate, and a halftone phase shift film formed on the substrate, the halftone phase shift film including at least one layer composed of silicon, nitrogen and oxygen, wherein the halftone phase shift film has a phase shift of at least 150° and up to 200° and a transmittance of at least 20%, with respect to exposure light having a wavelength of up to 200 nm, and a film surface having a surface roughness RMS of up to 0.8 nm, and to an in-plane variation of transmittance calculated from the maximum transmittance $T_{max}$ and the minimum transmittance $T_{min}$ within a mask pattern forming area by the following expression:

$$(T_{max}-T_{min})/(T_{max}+T_{min})\times 100$$

is up to 2%.

Preferably, the layer composed of silicon, nitrogen and oxygen has a total content of nitrogen and oxygen of at least 50 at %, and/or an oxygen content of at least 15 at %.

Preferably, the halftone phase shift-type photomask blank includes a second layer composed of a chromium-containing material, the second layer consisting of a single layer or a multilayer.

In another aspect, the invention provides a halftone phase shift-type photomask manufactured from the halftone phase shift-type photomask blank.

In a further aspect, the invention provides a method of manufacturing the halftone phase shift-type photomask blank including the step of forming the halftone phase shift film by sputtering, wherein in the step, the layer composed of silicon, nitrogen and oxygen is formed by sputtering with disposing at least one silicon target in a chamber and feeding argon gas, nitrogen gas and oxygen gas into the chamber.

Preferably, in the method, the flow rate of the nitrogen gas is set in accordance with a hysteresis curve that is obtained when the flow rate of nitrogen gas fed into the chamber is swept by increasing the flow rate, and then decreasing the flow rate, the hysteresis curve being drawn by the flow rate and a sputtering voltage or a sputtering current measured on one target upon the sweeping, wherein the sputtering for forming the layer composed of silicon, nitrogen and oxygen is performed under a sputtering condition of transition mode in which a flow rate of nitrogen gas is within a range between more than the lowest flow rate and less than the highest flow rate of the hysteresis.

Preferably, in the method, the sputtering for the layer composed of silicon, nitrogen and oxygen is performed under a chamber pressure of at least 0.05 Pa and less than 0.15 Pa.

Preferably, the method includes the step of heat treating at a temperature of at least 200° C. and up to 500° C. for at least 5 minutes after the halftone phase shift film has been formed.

Advantageous Effects of the Invention

According to the invention, a halftone phase shift-type photomask blank and a halftone phase shift-type photomask that include a halftone phase shift film having a good uniformity in film quality, particularly, high in-plane uniformity of transmittance can be provided with ensuring a necessary phase shift and a necessary transmittance for the halftone phase shift film used with light having a wavelength of up to 200 nm such as ArF excimer laser.

BRIEF DESCRIPTION OF THE DRAWINGS

FIG. 3 is a diagram showing a hysteresis curve (current value with respect to nitrogen gas flow rate) drawn in Examples 5 and 6.

FIG. 4 is a scattering diagram showing in-plane variation of transmittance with respect to surface roughness RMS in Examples and Comparative Examples.

DESCRIPTION OF THE PREFERRED EMBODIMENTS

A halftone phase shift-type photomask blank of the invention includes a transparent substrate such as a quartz substrate, and a halftone phase shift film that is formed on the transparent substrate. A halftone phase shift-type photomask of the invention includes a transparent substrate such as a quartz substrate, and a mask pattern (photomask pattern) of a halftone phase shift film that is formed on the transparent substrate.

The transparent substrate in the invention is preferably, for example, a 6 inch square, 0.25 inch thick transparent substrate, called 6025 substrate specified by the SEMI standard, which is often denoted by a 152 mm square, 6.35 mm thick transparent substrate, according to the SI unit system.

Figure 1A:
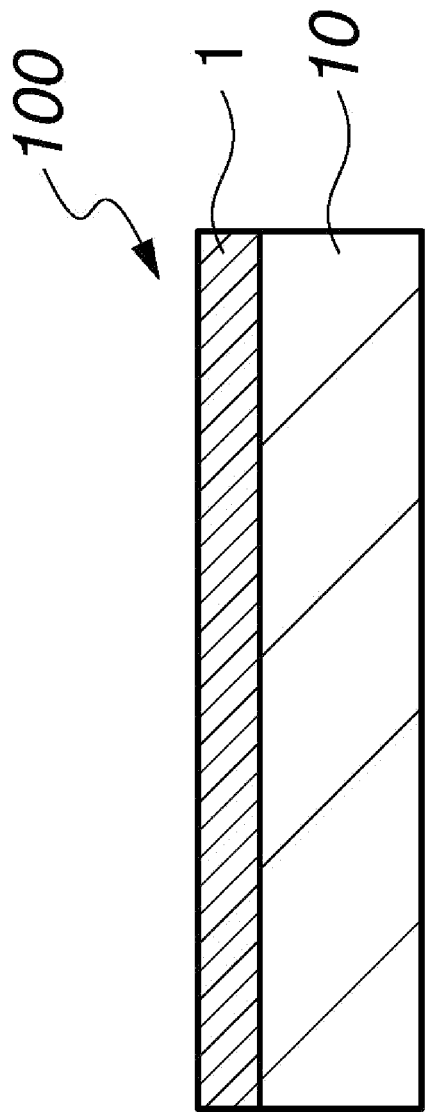
FIGS. 1A and 1B are cross-sectional views illustrating an exemplary halftone phase shift-type photomask blank and an exemplary halftone phase shift-type photomask of the invention.
Figure 1B:
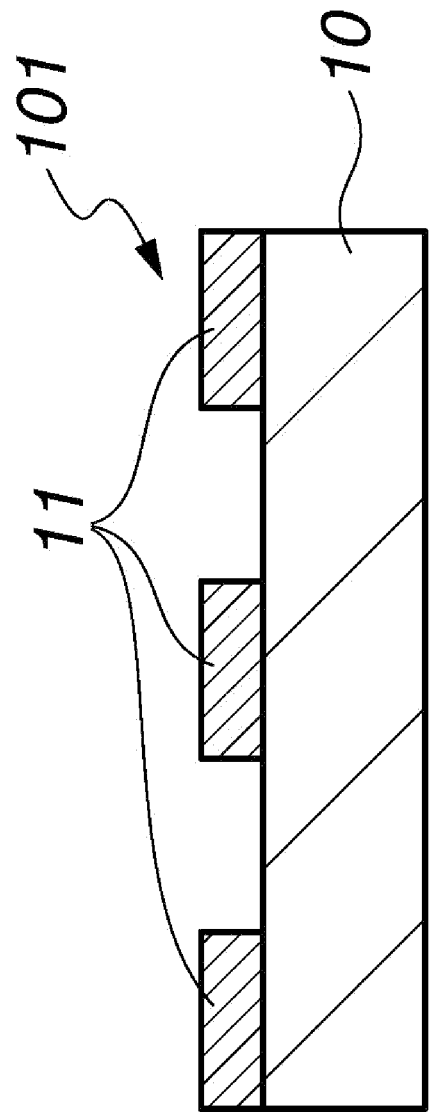

FIG. 1A is a cross-sectional view illustrating an exemplary halftone phase shift-type photomask blank of the invention. In this embodiment, a halftone phase shift-type photomask blank 100 includes a transparent substrate 10, and a halftone phase shift film 1 formed on the transparent substrate 10. FIG. 1B is a cross-sectional view illustrating an exemplary halftone phase shift-type photomask of the invention. In this embodiment, a halftone phase shift-type photomask 101 includes a transparent substrate 10, and a halftone phase shift film pattern 11 formed on the transparent substrate 10. The halftone phase shift-type photomask can be obtained by using the halftone phase shift-type photomask blank and forming a pattern of the halftone phase shift film.

The halftone phase shift film of the invention has a predetermined phase difference (phase shift) and a predetermined transmittance with respect to light having a wavelength of up to 200 nm such as ArF excimer laser (wavelength of 193 nm) at a predetermined thickness. The halftone phase shift film includes at least one layer composed of silicon, nitrogen and oxygen. The layer composed of silicon, nitrogen and oxygen preferably consists substantively of the three elements other than inevitable impurities.

The halftone phase shift film may be designed so as to satisfy necessary phase shift and transmittance for phase shift film. The phase shift film may consist of a single layer a plurality of layers. In the case that the phase shift film consists of a plurality of layers, each of the layers is preferably a layer composed of silicon, nitrogen and oxygen. In either case of a single layer or a plurality of layers, each layer constituting the single layer or the plurality of layers may be a single composition layer (a layer in which the composition does not very in the thickness direction) or a composition graded layer (a layer in which the composition varies in the thickness direction).

The phase shift of the exposure light in the invention may be enough to be able to increase contrast at the boundary between an area having the phase shift film (phase shift area) and an area without the phase shift film, as a result of interference due to phase shift between exposure lights passing through the respective areas. The phase shift may be at least 150°, preferably at least 170°, and up to 200°, preferably up to 190°. Meanwhile, a transmittance of the phase shift film in the invention may be at least 20%, preferably at least 25%, and up to 90%, preferably up to 70% with respect to exposure light. The phase shift and transmittance may satisfy the above-mentioned ranges within the whole of an area in which a mask pattern will be formed in a film surface of the halftone phase shift film (a mask pattern forming area). In the invention, in case of a 6025 substrate, the mask pattern forming area may be within 135 mm square, particularly within 132 mm square at the central portion of the film surface.

A surface roughness of the halftone phase shift film depends on a surface roughness of the transparent substrate. A surface roughness RMS of the film surface of the halftone phase shift film, particularly, a surface roughness RMS within the mask pattern forming area is preferably up to 0.8 nm, more preferably up to 0.5 nm, most preferably up to 0.3 nm. In the invention, the surface roughness RMS may be measured by measuring a tendency of the surface roughness of the film surface of the halftone phase shift film in advance, and the surface roughness RMS may be represented by a value of the portion having the largest surface roughness RMS. For example, in case that the halftone phase shift film is formed by sputtering and the surface roughness of the central portion of the film surface is the highest, the surface roughness RMS of the whole of the film surface of the halftone phase shift film may satisfy the above-mentioned range, when the surface roughness RMS of the central portion of the film surface is within the above-mentioned range. The central portion of the film surface can be defined within an area of 20 mm from the center of the halftone phase shift film formed on the main surface (film forming surface) of the substrate. A lower limit of the surface roughness RMS is preferably at least 0.05 nm, however, not limited thereto. If the surface roughness RMS is less than 0.05 nm, adhesion between the halftone phase shift film and the transparent substrate may deteriorate.

An in-plane variation of transmittance within the mask pattern forming area of the film surface of the halftone phase shift film is up to 2%, preferably up to 1%. The in-plane variation of transmittance is calculated from the maximum transmittance $T_{max}$ and the minimum transmittance $T_{min}$ within the mask pattern forming area by the following expression:

$$(T_{max}-T_{min})/(T_{max}+T_{min})\times 100.$$

In the invention, a halftone phase shift-type photomask with high in-plane uniformity of transmittance can be obtained by forming the halftone phase shift film so as to have the surface roughness RMS of the film surface within the above range. A lower limit of the in-plane variation of transmittance is ideally 0%. In this regard, a practical lower limit is at least 0.3%, however, not limited thereto.

In the film composed of silicon, nitrogen and oxygen that constitutes the halftone phase shift film, a total content of nitrogen and oxygen is preferably at least 50 at %, more preferably at least 53 at %, most preferably at least 55 at %, and preferably up to 60 at %, more preferably up to 58 at %. In the film composed of silicon, nitrogen and oxygen that constitutes the halftone phase shift film, an oxygen content is preferably more than 10 at %, more preferably at least 15 at %, most preferably at least 20 at %, and preferably up to 40 at %, more preferably up to 30 at %. If the oxygen content is 10 at % or less, the transmittance of the halftone phase shift film may be less than 20%.

When a whole thickness of the halftone phase shift film is thin, fine patterns can be readily formed. Thus, the whole thickness of the halftone phase shift film in the invention may be up to 120 nm, preferably up to 100 nm. Meanwhile, the lower limit of the thickness of the halftone phase shift film may be set as long as the desired optical characteristics may be obtained with exposure light, and is typically at least 50 nm, however not limited thereto.

The halftone phase shift film consisting multiple layers may include an oxidized surface layer formed as the outermost layer on the top surface side (on the side remote from the transparent substrate), for the purpose of suppressing change of properties of the halftone phase shift film. The oxidized surface layer may have an oxygen content of at least 20 at %, preferably at least 50 at %. Examples of methods for forming the oxidized surface layer specifically include atmospheric oxidation (natural oxidation); and forced oxidation treatment such as treatment of a sputtered film with ozone gas or ozonated water, or heating at least 300° C. in an oxygen-containing atmosphere such as oxygen gas atmosphere, by heating in oven, lamp annealing or laser heating. The oxidized surface layer preferably has a thickness of up to 10 nm, more preferably up to 5 nm, most preferably up to 3 nm. An effect of the oxidized surface layer is obtainable normally with a thickness of at least 1 nm. While the oxidized surface layer may be formed by sputtering under an increased oxygen amount, the oxidized surface layer is more preferably formed by the aforementioned atmospheric oxidation or oxidation treatment in terms of obtaining the layer with fewer defects.

The halftone phase shift film in the invention may be formed by known methods for forming film. The halftone phase shift film is preferably formed by sputtering by which highly homogenous film is easily obtainable. The sputtering may be either DC sputtering or RF sputtering, however, magnetron sputtering is more preferable. Target and sputtering gas are properly selected depending on kind and composition of the layer to be formed. Examples of the target include silicon-containing targets such as silicon target, silicon nitride target, and a target containing both of silicon and silicon nitride. The nitrogen content and the oxygen content may be controlled by reactive sputtering using any of reactive gases such as nitrogen gas ($N_2$ gas), oxygen gas ($O_2$ gas), and nitrogen oxide gases ($N_2O$ gas, NO gas and $NO_2$ gas) under properly controlling an amount of feeding. Rare gases such as helium gas, neon gas and argon gas are also employable as the sputtering gas.

In the forming step of the halftone phase shift film by sputtering for the halftone phase shift-type photomask blank of the invention, the film composed of silicon, nitrogen and oxygen may be formed by sputtering with disposing at least one silicon target in a chamber and feeding argon gas, nitrogen gas and oxygen gas into the chamber. At this time, it is preferable to form the film while rotating the substrate, particularly, rotating the substrate on the axis passing through the center of the substrate surface (the surface on which the film is formed) as the rotation axis.

In the sputtering to form the film composed of silicon, nitrogen and oxygen for the manufacturing the halftone phase shift-type photomask blank of the invention, film forming conditions (sputtering conditions) is preferably set in accordance with a hysteresis curve that is obtained when the flow rate of nitrogen gas fed into the chamber is swept by increasing the flow rate, and then decreasing the flow rate. The hysteresis curve is drawn by the flow rate and a sputtering voltage or a sputtering current measured on one target upon the sweeping.

In an experiment, reactive sputtering is performed in a chamber in vacuum or reduced pressure using a target, an inert gas and a reactive gas. While the power applied across the target and the flow rate of the inert gas are kept constant, the flow rate of the reactive gas is gradually increased from the zero gas feed state. As the flow rate of the reactive gas is increased, the sputtering voltage (i.e., target voltage) gradually declines. The voltage behavior is such that the voltage follows a slow decline (at a gentle slope) at the initial, a rapid decline (at a sharp slope) midway, and finally a slow decline (at a gentle slope) again. After the flow rate of the reactive gas is increased over the range where the voltage takes a slow decline again, inversely the flow rate of the reactive gas is decreased. As the flow rate of the reactive gas is decreased, the sputtering voltage (i.e., target voltage) gradually increases. At this stage, the voltage behavior is such that the voltage follows a slow increase (at a gentle slope) at the initial, a rapid increase (at a sharp slope) midway, and finally a slow increase 1s (at a gentle slope) again. In the region of the rapid decline or increase (at a sharp slope), the sputtering voltage recorded during the ascent of reactive gas flow rate is not coincident with the sputtering voltage recorded during the descent of reactive gas flow rate, specifically the sputtering voltage recorded during the descent of reactive gas flow rate is lower.

In another experiment, reactive sputtering is performed in a chamber in vacuum or reduced pressure using a target and a reactive gas. While the power applied across the target and the flow rate of the inert gas are kept constant, the flow rate of the reactive gas is gradually increased from the zero gas feed state. As the flow rate of the reactive gas is increased, the sputtering current (i.e., target current) gradually increases. The current behavior is such that the current follows a slow increase (at a gentle slope) at the initial, a rapid increase (at a sharp slope) midway, and finally a slow increase (at a gentle slope) again. After the flow rate of the reactive gas is increased over the range where the current takes a slow increase again, inversely the flow rate of the reactive gas is decreased. As the flow rate of the reactive gas is decreased, the sputtering current (i.e., target current) gradually declines. At this stage, the current behavior is such that the current follows a slow decline (at a gentle slope) at the initial, a rapid decline (at a sharp slope) midway, and finally a slow decline (at a gentle slope) again. In the region of the rapid increase or decline (at a sharp slope), the sputtering current recorded during the ascent of reactive gas flow rate is not coincident with the sputtering current recorded during the descent of reactive gas flow rate, specifically the sputtering current recorded during the descent of reactive gas flow rate is higher.

As is evident from the above reactive sputtering experiments, a hysteresis curve as shown in FIG. 3, for example, and similar to the well-known magnetic hysteresis curve (B-H curve), is drawn by applying a constant power across the target, feeding an inert gas at a constant flow rate into a chamber, feeding the reactive gas into the chamber, increasing and then reducing the flow rate of the reactive gas for thereby sweeping the flow rate of the reactive gas, and measuring a sputtering voltage or current value upon sweeping of the flow rate of the reactive gas, for the reason that the sputtering voltage or current value is not coincident between the ascent and the descent of reactive gas flow rate.

In the hysteresis curve, a sputtering state in a range where the reactive gas flow rate is equal to or less than the lower limit of the hysteresis region is referred to as "metal mode", a sputtering state in a range where the reactive gas flow rate is equal to or more than the upper limit of the hysteresis region is referred to as "reaction mode", and a sputtering state in a range between the metal mode and the reaction mode where a flow rate of reactive gas is between more than the lowest flow rate and less than the highest flow rate is referred to as "transition mode". In the invention, the sputtering for forming the film composed of silicon, nitrogen and oxygen is preferably performed in the transition mode. At this time, a chamber pressure (an inner pressure of a chamber) is set to preferably at least 0.05 Pa, more preferably at least 0.08 Pa, and preferably less than 0.15 Pa, more preferably up to 0.13 Pa. If the chamber pressure in the chamber is less than 0.05 Pa, discharge failure may occur during sputtering. A surface roughness RMS of the halftone phase shift film is affected by the chamber pressure during film forming and usually tends to be proportional to the chamber pressure. Thus, a lower chamber pressure is preferable. If the chamber pressure is outside of the above-mentioned range and high, the surface roughness RMS may not be sufficiently reduced. Meanwhile, when the chamber pressure is outside of the above-mentioned range and low, a rate of the film forming may decrease, and a film stress may rather increase by the heat treatment described later.

After forming the halftone phase shift film, the halftone phase shift film is preferably heat treated (annealed) at a temperature of at least 200° C. and up to 500° C. for at least 5 minutes. The heat treatment time is normally up to 24 hours. The heat treatment may be performed in the sputtering chamber or after transfer to a heat treatment furnace which is different from the sputtering chamber. The heat treatment atmosphere may be an inert gas atmosphere such as helium gas or argon gas, vacuum, or even an oxygen-containing atmosphere such as oxygen gas atmosphere. By the heat treatment, the film stress can be reduced, and the change in the film quality due to the heat treatment in the process of manufacturing the halftone phase shift-type photomask from the halftone phase shift-type photomask blank can be reduced. Particularly, when the surface roughness RMS of the halftone phase shift film is reduced by forming the layer composed of silicon, nitrogen and oxygen by sputtering in a transition mode, in-plane distribution of oxynitridation degree of the film surface of the halftone phase shift film including the layer composed of silicon, nitrogen and oxygen is stabilized. In the halftone phase shift film of the invention, in-plane distribution of film quality is not readily to deteriorate even if such heat treatment is performed. Thus, the heat treatment has many advantages.

The halftone phase shift-type photomask blank of the invention may include a second layer consisting of a single layer or multiple layers, and is formed over the halftone phase shift film. The second layer is usually provided adjacent to the halftone phase shift film. The second layer is specifically exemplified by alight shielding film, a combination of a light shielding film and an antireflection film, and a process-aid film that functions as a hard mask in the process of patterning the halftone phase shift film. In case where a third layer as described below, the second layer may be used as a process-aid film that functions as an etching stopper (etching stopper film) in the process of patterning the third layer. Material of the second layer is preferably a chromium-containing material.

Figure 2A:
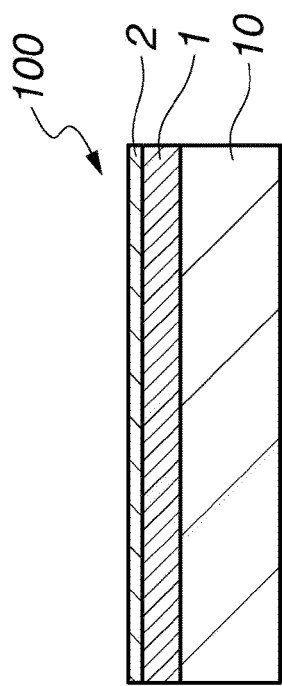
FIGS. 2A to 2C are cross-section views illustrating other examples of a halftone phase shift-type photomask blank of the invention.

This embodiment is specifically exemplified by a halftone phase shift-type photomask blank illustrated in FIG. 2A. FIG. 2A is a cross-sectional view illustrating an exemplary halftone phase shift-type photomask blank of the invention. In this embodiment, a halftone phase shift-type photomask blank 100 includes a transparent substrate 10, a halftone phase shift film 1 formed on the transparent substrate 10, and a second layer 2 formed on the halftone phase shift film 1.

The halftone phase shift-type photomask blank of the invention may include a light shielding film, or an etching mask film that functions as a hard mask for forming a pattern to the halftone phase shift film, as the second layer, provided over the halftone phase shift film. Alternatively, alight shielding film and an antireflection film may be combined to form the second layer. The second layer including a light shielding film can provide an area that is fully block the exposure light in a halftone phase shift-type photomask. The light shielding film and the antireflection film may also be used as a process-aid film in the etching. There are many reports regarding film structure and materials for the light shielding film and antireflection film (JP-A 2007-33469 (Patent Document 2), JP-A 2007-233179 (Patent Document 3), for example). Preferred film structure having the light shielding film and the antireflection film combined therein is exemplified by a structure in which a light shielding film composed of a chromium-containing material is provided, and an antireflection film composed of a chromium-containing material for reducing reflection from the light shielding film is further provided. The light shielding film and the antireflection film may consist of a single layer or multiple layers. Examples of the chromium-containing material of the light shielding film and the antireflection film include chromium (simple substance), and a chromium compound such as chromium oxide (CrO), chromium nitride (CrN), chromium carbide (CrC), chromium oxynitride (CrON), chromium oxy carbide (CrOC), chromium nitride carbide (CrNC) and chromium oxynitride carbide (CrONC). Notably, the chemical formulae that represent the chromium-containing materials merely denote constituent elements, rather than compositional ratios of the constituent elements (the same shall apply to the chromium-containing materials hereinafter).

For the second layer as the light shielding film, or the combination of a light shielding film and an antireflection film, the chromium compound in the light shielding film has a chromium content of preferably at least 40 at %, more preferably at least 60 at %, and preferably less than 100 at %, more preferably up to 99 at %, most preferably up to 90 at %. The oxygen content is preferably up to 60 at %, more preferably up to 40 at %, and preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, and most preferably 100 at %.

For the second layer as the combination of a light shielding film and an antireflection film, the antireflection film is preferably composed of a chromium compound, and the chromium compound has a chromium content of preferably at least 30 at %, more preferably at least 35 at %, and up to 70 at %, more preferably up to 50 at %. The oxygen content is preferably up to 60 at %, and preferably at least 1 at %, more preferably at least 20 at %. The nitrogen content is preferably up to 50 at %, more preferably up to 30 at %, and preferably at least 1 at %, more preferably at least 3 at %. The carbon content is preferably up to 20 at %, more preferably up to 5 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the light shielding film, or the combination of a light shielding film and an antireflection film, the second layer has a thickness of usually 20 to 100 nm, and preferably 40 to 70 nm. A total optical density of the halftone phase shift film and the second layer are preferably at least 2.0, more preferably at least 2.5, most preferably at least 3.0, with respect to exposure light having a wavelength of up to 200 nm.

Over the second layer of the halftone phase shift-type photomask blank of the invention, a third layer consisting of a single layer or multiple layers may be provided. The third layer is usually provided adjacent to the second layer. The third layer is specifically exemplified by a process-aid film that functions as a hard mask in the process of patterning the second layer, a light shielding film, and a combination of a light shielding film and an antireflection film. A material composing the third layer is preferably a silicon-containing material, particularly a silicon-containing material free of chromium.

Figure 2B:
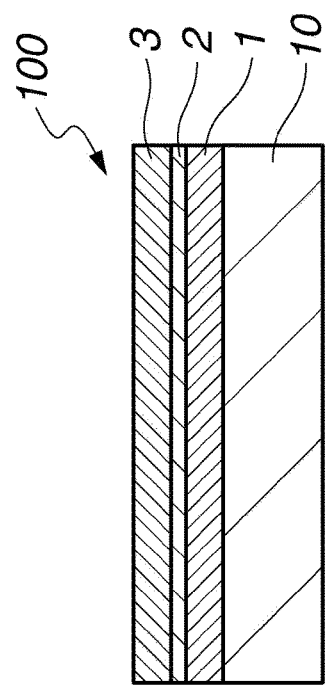

This embodiment is specifically exemplified by a halftone phase shift-type photomask blank illustrated in FIG. 2B. FIG. 2B is a cross-sectional view illustrating an exemplary halftone phase shift-type photomask blank of the invention. In this embodiment, the halftone phase shift-type photomask blank 100 includes a transparent substrate 10, a halftone phase shift film 1 formed on the transparent substrate 10, a second layer 2 formed on the halftone phase shift film 1, and a third layer 3 formed on the second layer 2.

For the second layer as the light shielding film, or the combination of a light shielding film and an antireflection film, a process-aid film (etching mask film) which functions as a hard mask in the process of patterning the second layer may be provided as the third layer. In case where a fourth layer is employed as described below, the third layer may be used as a process-aid film that functions as an etching stopper (etching stopper film) in the process of patterning the fourth layer. The process-aid film is preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the process-aid film, the process-aid film is preferably composed of a silicon compound. The silicon compound has a silicon content of preferably at least 20 at %, more preferably at least 33 at %, and preferably up to 95 at %, and more preferably up to 80 at %. The nitrogen content is preferably up to 50 at %, more preferably up to 30 at %, and preferably at least 1 at %. The oxygen content is preferably up to 70 at %, more preferably up to 66 at %, and if the etching rate is necessarily adjusted, preferably at least 1 at %, more preferably at least 20 at %. The transition metal may or not be contained. When the transition metal is contained, its content is preferably up to 35 at %, more preferably up to 20 at %. In this case, a total content of silicon, oxygen, nitrogen and transition metal is preferably at least 95 at %, more preferably at least 99 at %, most preferably 100 at %.

For the second layer as the light shielding film, or the combination of a light shielding film and an antireflection film, and for the third layer as the process-aid film, the second layer has a thickness of usually 20 to 100 nm, and preferably 40 to 70 nm, and the third layer typically has a thickness of usually 1 to 30 nm, and preferably 2 to 15 nm. A total optical density of the halftone phase shift film and the second layer are preferably at least 2.0, more preferably at least 2.5, most preferably at least 3.0, with respect to exposure light having a wavelength of up to 200 nm.

For the second layer as the process-aid film, a light shielding film may be provided as the third layer. The light shielding film in combination with the antireflection film may be provided as the third layer. In this case, the second layer may be used as a process-aid film (etching mask film) that functions as a hard mask in the process of patterning the halftone phase shift film, and as a process-aid film (etching stopper film) in the process of patterning the third layer. The process-aid film is exemplified by a film composed of a chromium-containing material, such as disclosed in JP-A 2007-241065 (Patent Document 4). The process-aid film may consist of a single layer or multiple layers. Examples of the chromium-containing material of the process-aid film include chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the second layer as the process-aid film, the chromium compound in the second layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 55 at %, and if the etching rate is necessarily adjusted, preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, particularly at least 99 at %, most preferably 100 at %.

The light shielding film and the antireflection film as the third layer are preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the light shielding film, or the combination of a light shielding film and an antireflection film, the light shielding film and the antireflection film are preferably composed of a silicon compound. The silicon compound has a silicon content of preferably at least 10 at %, more preferably at least 30 at %, and preferably less than 100 at %, more preferably up to 95 at %. The nitrogen content is preferably up to 50 at %, preferably up to 40 at %, and most preferably up to 20 at %, and if the etching rate is necessarily adjusted, preferably at least 1 at %. The oxygen content is preferably up to 60 at %, more preferably up to 30 at %, and if the etching rate is necessarily adjusted, preferably at least 1 at %. The transition metal content is preferably up to 35 at %, preferably up to 20 at %, and preferably at least 1 at %. In this case, a total content of silicon, oxygen, nitrogen and transition metal is preferably at least 95 at %, more preferably at least 99 at %, most preferably 100 at %.

For the second layer as the process-aid film, and for the third layer as the light shielding film, or the combination of a light shielding film and an antireflection film, the second layer has a thickness of usually 1 to 20 nm, and preferably 2 to 10 nm, and the third layer has a thickness of usually 20 to 100 nm, and preferably 30 to 70 nm. A total optical density of the halftone phase shift film, the second layer and the third layer are preferably at least 2.0, more preferably at least 2.5, most preferably at least 3.0, with respect to exposure light having a wavelength of up to 200 nm.

Over the third layer of the halftone phase shift-type photomask blank of the invention, a fourth layer consisting of a single layer or multiple layers may be provided. The fourth layer is usually provided adjacent to the third layer. The fourth layer is specifically exemplified by a process-aid film that functions as a hard mask in the process of patterning the third layer. A material of the fourth layer is preferably a chromium-containing material.

Figure 2C:
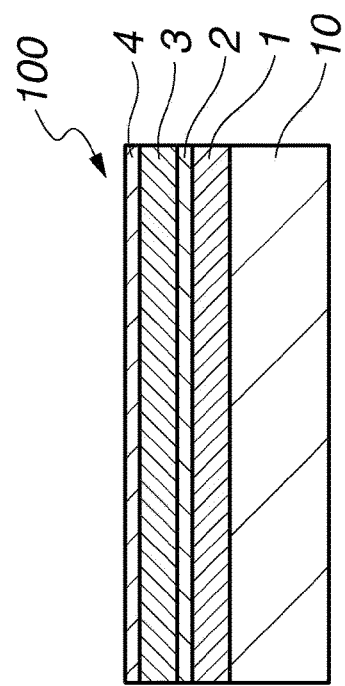

This embodiment is specifically exemplified by a halftone phase shift-type photomask blank illustrated in FIG. 2C. FIG. 2C is a cross-sectional view illustrating an exemplary halftone phase shift-type photomask blank of the invention. In this embodiment, the halftone phase shift-type photomask blank 100 includes a transparent substrate 10, a halftone phase shift film 1 formed on the transparent substrate 10, a second layer 2 formed on the halftone phase shift film 1, a third layer 3 formed on the second layer 2, and a fourth layer 4 formed on the third layer 3.

For the third layer as the light shielding film, or the combination of a light shielding film and an antireflection film, a process-aid film (etching mask film) which functions as a hard mask in the process of patterning the third layer may be provided as the fourth layer. The process-aid film is preferably composed of a material that differs in etching characteristics from the third layer, such as a material resistant to fluorine-based dry etching for a silicon-containing material, in particular, a chromium-containing material which can be etched by chlorine-based gases containing oxygen. The chromium-containing material is exemplified by chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the fourth layer as the process-aid film the fourth layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 40 at %, and if the etching rate is necessarily adjusted, preferably at least 1 at %. The nitrogen content is preferably up to 50 at %, more preferably up to 40 at %, and if the etching rate is necessarily adjusted, preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the process-aid film, for the third layer as the light shielding film, or the combination of a light shielding film and an antireflection film, and for the fourth layer as the process-aid film, the second layer has a thickness of usually 1 to 20 nm, and preferably 2 to 10 nm, the third layer has a thickness of usually 20 to 100 nm, and preferably 30 to 70 nm, and the fourth layer has a thickness of usually 1 to 50 mu, and preferably 2 to 30 nm. A total optical density of the halftone phase shift film, the second layer and the third layer are preferably at least 2.0, more preferably at least 2.5, most preferably at least 3.0, with respect to exposure light having a wavelength of up to 200 nm.

The film composed of the chromium-containing material for the second layer and the fourth layer may be formed by reactive sputtering using a target such as chromium target, or a target containing chromium that is added one or more elements selected from the group consisting of oxygen, nitrogen and carbon, and using a sputtering gas containing a rare gas such as Ar. He and Ne that is properly added with a reactive gas selected from the group consisting of an oxygen-containing gas, a nitrogen-containing gas and a carbon-containing gas, according to a composition of the film to be formed.

Meanwhile, the film composed of the silicon-containing material for the third layer may be formed by reactive sputtering using a target such as a silicon target, a silicon nitride target, a target containing both of silicon and silicon nitride, a transition metal target, and a composite target of silicon and transition metal, and using a sputtering gas containing a rare gas such as Ar, He and Ne that is properly added with a reactive gas selected from the group consisting of an oxygen-containing gas, a nitrogen-containing gas and a carbon-containing gas, according to a composition of the film to be formed.

The halftone phase shift-type photomask of the invention may be manufactured by any of usual methods from the halftone phase shift-type photomask blank. From an exemplary halftone phase shift-type photomask blank including a film composed of a chromium-containing material formed as a second layer on a halftone phase shift film, the halftone phase shift-type photomask may be manufactured typically by the following processes.

First, an electron beam resist film is formed on the second layer of the halftone phase shift-type photomask blank, a pattern is drawn by electron beam, followed by a predetermined operation of development, to obtain a resist pattern. Next, the obtained resist pattern is used as an etching mask, and the resist pattern is transferred to the second is layer by chlorine-based dry etching containing oxygen, to obtain a second layer pattern. Next, the obtained second layer pattern is used as an etching mask, and the second layer pattern is transferred to the halftone phase shift film by fluorine-based dry etching, to obtain a halftone phase shift film pattern. In case where a part of the second layer is needed to be remained, another resist pattern that protects such part to be remained is formed on the second layer, and a part of the second layer not protected with the resist pattern is removed by chlorine-based dry etching containing oxygen. The resist pattern is then removed by a usual method to obtain the halftone phase shift-type photomask.

From an exemplary halftone phase shift-type photomask blank including a light shielding film or a combination of a light shielding film and an antireflection film, composed of a chromium-containing material, as a second layer on a halftone phase shift film, and a process-aid film composed of a silicon-containing material as a third layer on the second layer, the halftone phase shift-type photomask may be manufactured typically by the following processes.

First, an electron beam resist film is formed on the third layer of the halftone phase shift-type photomask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern. The resist pattern is then removed, and the obtained second layer pattern is used as an etching mask, and the second layer pattern is transferred to the halftone phase shift film by fluorine-based dry etching, to obtain a halftone phase shift film pattern and to concurrently remove the third layer pattern. Next, another resist pattern that protects a part of the second layer to be remained is formed on the second layer, and a part of the second layer not protected with the resist pattern is removed by chlorine-based dry etching containing oxygen. The resist pattern is then removed by a usual method to obtain the halftone phase shift-type photomask.

Meanwhile, from an exemplary halftone phase shift-type photomask blank including a process-aid film composed of a chromium-containing material as a second layer on a halftone phase shift film, and a light shielding film or a combination of a light shielding film and an antireflection film, composed of a silicon-containing material, as a third layer on the second layer, the halftone phase shift-type photomask may be manufactured typically by the following processes.

First, an electron beam resist film is formed on the third layer of the halftone phase shift-type photomask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern that a part where the halftone phase shift film will be removed has been removed. The resist pattern is then removed. Next, another resist pattern that protects a part of the third layer to be remained is formed on the third layer, and the obtained second layer pattern is used as an etching mask, and the second layer pattern is transferred to the halftone phase shift film by fluorine-based dry etching, to obtain a halftone phase shift film pattern, and to concurrently remove a part of the third layer which is not protected with the resist pattern. The resist pattern is then removed by a usual method. Further, the part of the second layer, which is exposed in the part where the third layer has been removed, is then removed by chlorine-based dry etching containing oxygen, to obtain the halftone phase shift-type photomask.

Further, from an exemplary halftone phase shift-type photomask blank including a process-aid film composed of a chromium-containing material as a second layer on a halftone phase shift film, a light shielding film or a combination of a light shielding film and an antireflection film, composed of a silicon-containing material, as a third layer on the second layer, and a process-aid film composed of a chromium-containing material, as a fourth layer on the third layer, the halftone phase shift-type photomask may be manufactured typically by the following processes.

First, an electron beam resist film is formed on the fourth layer of the halftone phase shift-type photomask blank, a pattern is drawn by electron beam, followed by a predetermined operation of development, to obtain a resist pattern. Next, the obtained resist pattern is used as an etching mask, and the resist pattern is transferred to the fourth layer by chlorine-based dry etching containing oxygen, to obtain a fourth layer pattern. Next, the obtained fourth layer pattern is used as an etching mask, and the fourth layer pattern is transferred to the third layer by fluorine-based dry etching, to obtain a third layer pattern. The resist pattern is then removed. Next, another resist pattern that protects a part of the third layer to be remained is formed on the fourth layer, and the obtained third layer pattern is used as an etching mask, and the third layer pattern is transferred to the second layer by chlorine-based dry etching containing oxygen, to obtain a second layer pattern, and to concurrently remove a part of the fourth layer which is not protected with the resist pattern. Next, the second layer pattern is used as an etching mask, and the second layer pattern is transferred to the halftone phase shift film by fluorine-based dry etching, to obtain a halftone phase shift film pattern, and to concurrently remove a part of the third layer which is not protected with the resist pattern. The resist pattern is then removed by a usual method. Further, the part of the second layer, which is exposed in the part where the third layer has been removed, and the part of the fourth layer exposed in the part where the resist pattern has been removed, are then removed by chlorine-based dry etching containing oxygen, to obtain the halftone phase shift-type photomask.

EXAMPLES

Examples of the invention are given below by way of illustration and not by way of limitation.

Examples 1 to 9 and Comparative Examples 1 to 7

A 6025 quartz substrate (152 mm square, 6.35 mm thick) was placed in a chamber of a sputtering apparatus, and sputtering was performed by using a silicon (Si) target as a sputtering target, and argon gas, nitrogen gas and oxygen gas, as sputtering gases, under conditions of a constant power applied to the silicon (Si) target, and constant flow rates of argon gas and oxygen gas, with varying a flow rate of nitrogen gas and measuring a current across the target, thereby to obtain a hysteresis curve. In particular, the electric power shown in Table 1 was applied to the silicon target, the argon gas and the oxygen gas were set to the flow rates shown in Table 1, and the sputtering was started in the state where nitrogen gas was flowed into the chamber at a flow rate of 10 SCCM. Thereafter, the flow rate of the nitrogen gas was finally increased to 50 SCCM, and then the flow rate of the nitrogen flow rate was inversely decreased from 50 SCCM to 10 SCCM. The hysteresis curve drawn in Examples 5 and 6 is shown in FIG. 3.

Next, a halftone phase shift film consisting of a single layer composed of silicon, nitrogen and of oxygen and having a film thickness shown in Table 2 was formed on a 6025 quartz substrate by using a silicon target as a sputtering target, and nitrogen gas, oxygen gas and argon gas, as sputtering gases. Based on the hysteresis curve drawn in the above way, the electric power shown in Table 1 was applied to the silicon target, argon gas, nitrogen gas and oxygen gas were set to the flow rates shown in Table 1, and the chamber pressure (pressure during forming the film) was set to the pressure shown in Table 1. The film forming mode applied to the sputtering is shown in Table 1. Next, the obtained halftone phase shift film was heat-treated at the temperature and for the time shown in Table 1 under an atmosphere in which nitrogen gas and oxygen gas were adjusted to about the same partial pressures in air, thereby a halftone phase shift-type photomask blank was obtained.

TABLE 1

|  |  | Film Forming Mode | Electric Power [W] | Gas Flow Rate [SCCM] | | | Film Forming Pressure [Pa] | Heat Treatment Temperature [° C.] | Heat Treatment Time [min] |
| --- | --- | --- | --- | --- | --- | --- | --- | --- | --- |
|  |  |  |  | Ar | N$_2$ | O$_2$ |  |  |  |
| Example | 1 | Transition | 1800 | 15 | 20 | 12.5 | 0.08 | 500 | 360 |
|  | 2 | Transition | 1800 | 18 | 20 | 8.25 | 0.10 | 285 | 360 |
|  | 3 | Transition | 1800 | 18 | 20 | 8.25 | 0.10 | 500 | 360 |
|  | 4 | Transition | 1800 | 18 | 20 | 8.90 | 0.10 | 500 | 360 |
|  | 5 | Transition | 1800 | 18 | 25 | 4.70 | 0.11 | 285 | 360 |
|  | 6 | Transition | 1800 | 18 | 25 | 4.70 | 0.11 | 500 | 360 |
|  | 7 | Transition | 1800 | 18 | 25 | 7.40 | 0.12 | 500 | 360 |
|  | 8 | Transition | 1800 | 23 | 25 | 5.60 | 0.14 | 500 | 360 |
|  | 9 | Transition | 1800 | 4 | 18 | 3.50 | 0.05 | 500 | 360 |
| Comparative Example | 1 | Reaction | 1800 | 18 | 40 | 2.30 | 0.15 | 285 | 360 |
|  | 2 | Reaction | 1800 | 18 | 40 | 2.30 | 0.15 | 500 | 360 |
|  | 3 | Reaction | 1800 | 18 | 40 | 4.80 | 0.16 | 500 | 360 |
|  | 4 | Transition | 1800 | 23 | 25 | 7.60 | 0.15 | 500 | 360 |
|  | 5 | Reaction | 1800 | 23 | 40 | 2.50 | 0.17 | 500 | 360 |
|  | 6 | Reaction | 1800 | 10 | 40 | 2.50 | 0.12 | 500 | 360 |
|  | 7 | Reaction | 1800 | 10 | 40 | 5.00 | 0.12 | 500 | 360 |

A surface roughness RMS of the obtained halftone phase shift film was measured by an atomic force microscope (AFM), NANO-IM-8, manufactured by Pacific Nanotechnology. A value at the center of the film surface, which was the largest in the film surface was shown as the surface roughness RMS. A phase difference (phase shift) and a transmittance in a mask pattern forming area of the obtained halftone phase shift film were measured by a phase shift and transmittance measurement system. MPM193, manufactured by Lasertec Corporation. Averages of phase shift and transmittance in-plane were calculated, and an in-plane variation of transmittance was calculated from the maximum transmittance $T_{max}$ and the minimum transmittance $T_{min}$ by the following expression:

$$(T_{max}-T_{min})/(T_{max}+T_{min})\times 100.$$

A composition of the obtained halftone phase shift film was measured by XPS. A ΔTIR of the obtained halftone phase shift film after heat treatment was measured by a flatness tester, Tropel® Ultra Flat™ 200Mask, manufactured by Corning Tropel Corporation. The results are shown in Table 2.

TABLE 2

| | | Film Thickness [nm] | Surface Roughness RMS [nm] | Phase Shift [°] | Transmittance [%] | In-plane Variation of Transmittance [%] | Composition [at %] | | | ΔTIR (after heat treatment) [μm] |
|---|---|---|---|---|---|---|---|---|---|---|
| | | | | | | | O | N | Si | |
| Example | 1 | 120 | 0.699 | 177 | 77.1 | 1.2 | 39 | 17 | 44 | −0.08 |
| | 2 | 71 | 0.435 | 177 | 21.1 | 0.8 | 23 | 34 | 43 | −0.18 |
| | 3 | 72 | 0.451 | 177 | 23.3 | 1.2 | 23 | 34 | 43 | −0.02 |
| | 4 | 73 | 0.499 | 177 | 31.1 | 1.1 | 26 | 32 | 42 | 0 |
| | 5 | 70 | 0.562 | 177 | 26.8 | 0.8 | 15 | 41 | 44 | −0.16 |
| | 6 | 68 | 0.565 | 177 | 31.0 | 1.5 | 15 | 41 | 44 | 0.05 |
| | 7 | 80 | 0.771 | 177 | 49.9 | 2.0 | 27 | 31 | 42 | 0.03 |
| | 8 | 70 | 0.658 | 177 | 28.9 | 1.6 | 17 | 39 | 44 | 0.10 |
| | 9 | 75 | 0.350 | 177 | 44.3 | 1.2 | 23 | 36 | 44 | −0.31 |
| Comparative Example | 1 | 66 | 0.801 | 177 | 24.6 | 2.2 | 11 | 44 | 45 | −0.07 |
| | 2 | 66 | 0.803 | 177 | 27.6 | 2.6 | 11 | 44 | 45 | 0.04 |
| | 3 | 77 | 0.983 | 177 | 45.6 | 3.7 | 25 | 33 | 42 | 0.06 |
| | 4 | 79 | 0.811 | 177 | 44.4 | 2.6 | 25 | 33 | 42 | 0.11 |
| | 5 | 68 | 0.867 | 177 | 28.5 | 3.3 | 12 | 43 | 45 | 0.11 |
| | 6 | 70 | 0.800 | 177 | 34.5 | 2.5 | 17 | 41 | 42 | −0.13 |
| | 7 | 84 | 1.005 | 177 | 59.0 | 2.6 | 31 | 29 | 40 | −0.07 |

In the results, although the surface roughness RMS varies according to the film forming conditions, the surface roughness RMS sputtered in reaction mode is high, and the in-plane variation of transmittance is more than 2%. A scattering diagram showing the in-plane variation of transmittance with respect to the surface roughness RMS in thirteen examples in total, which were heat-treated at 500° C., among Examples and Comparative Examples is shown in FIG. 4. From the diagram, it is found that there is a correlation between the surface roughness RMS and the in-plane variation of transmittance, the in-plane variation of transmittance can be controlled by reducing the surface roughness RMS, and a phase shift film having high in-plane uniformity can be obtained for a halftone phase shift film having a high transmittance. Further, it is found that a high transmittance halftone phase shift film having a reduced surface roughness RMS and a reduced in-plane variation of transmittance can be preferably obtained by setting the transition mode in the film forming condition of sputtering.

Japanese Patent Application No. 2019-176829 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a halftone phase shift-type photomask blank comprising a transparent substrate, and a halftone phase shift film formed in contact with the substrate, the halftone phase shift film consisting of a plurality of layers consisting of silicon, nitrogen and oxygen, wherein
the plurality of layers consisting of silicon, nitrogen and oxygen has an oxygen content of up to 39 at %,
the halftone phase shift film has a thickness of at least 71 nm, a phase shift of at least 150° and up to 200° and a transmittance of at least 20%, with respect to at least one exposure light having a wavelength of up to 200 nm, and a film surface having a surface roughness RMS of up to 0.8 nm, and
an in-plane variation of transmittance calculated from the maximum transmittance $T_{max}$ and the minimum transmittance $T_{min}$ within a mask pattern forming area by the following expression:

$(T_{max}-T_{min})/(T_{max}+T_{min})\times 100$ is up to 2%, wherein
the method comprises the step of forming the halftone phase shift film by sputtering, wherein
in the step, the plurality of layers consisting of silicon, nitrogen and oxygen is formed by sputtering under a chamber pressure of at least 0.05 Pa and less than 0.15 Pa with disposing at least one silicon target in a chamber and feeding argon gas, nitrogen gas and oxygen gas into the chamber wherein
a flow rate of the nitrogen gas is set in accordance with a hysteresis curve that is obtained when the flow rate of nitrogen gas fed into the chamber is swept by increasing the flow rate, and then decreasing the flow rate, the hysteresis curve being drawn by the flow rate and a sputtering voltage or a sputtering current measured on one target upon the sweeping, wherein
the sputtering for forming each of the plurality of layers consisting of silicon, nitrogen and oxygen is performed under a sputtering condition of transition mode in which a flow rate of nitrogen gas is within a range between more than the lowest flow rate and less than the highest flow rate of the hysteresis.

2. The method of claim 1 wherein the method comprises the step of heat treating the halftone phase shift film at a temperature of at least 200° C. and up to 500° C. for at least 5 minutes after the halftone phase shift film has been formed.

3. The method of claim 1 wherein the plurality of layers consisting of silicon, nitrogen and oxygen has a total content of nitrogen and oxygen of at least 50 at %.

* * * * *